United States Patent
Jin et al.

(10) Patent No.: US 7,179,148 B2
(45) Date of Patent: Feb. 20, 2007

(54) CATHODE WITH IMPROVED WORK FUNCTION AND METHOD FOR MAKING THE SAME

(75) Inventors: Sungho Jin, Millington, NJ (US); Victor Katsap, Belle Mead, NJ (US); Warren K. Waskiewicz, Clinton, NJ (US); Wei Zhu, Warren, NJ (US)

(73) Assignee: Agere Systems Inc., Allentown, PA (US)

( * ) Notice: Subject to any disclaimer, the term of this patent is extended or adjusted under 35 U.S.C. 154(b) by 157 days.

(21) Appl. No.: 10/963,156

(22) Filed: Oct. 12, 2004

(65) Prior Publication Data

US 2005/0046326 A1 Mar. 3, 2005

Related U.S. Application Data

(62) Division of application No. 09/338,520, filed on Jun. 23, 1999, now Pat. No. 6,815,876.

(51) Int. Cl.
*H01J 9/04* (2006.01)
(52) U.S. Cl. .......................................... 445/51; 445/46
(58) Field of Classification Search ................. 445/51, 445/46, 50
See application file for complete search history.

(56) References Cited

U.S. PATENT DOCUMENTS 3,488,549 A   1/1970  Amra
4,083,811 A   4/1978  Bachmann et al.
4,168,565 A   9/1979  Ishii et al.
4,184,100 A   1/1980  Takanshi et al.
4,274,030 A   6/1981  Buxbaum et al.

(Continued)

FOREIGN PATENT DOCUMENTS

EP       0 845 797 A2    6/1998

(Continued)

OTHER PUBLICATIONS

W. deVore et al., "High Emittance Electron Gun for Projection Lithography", 1998 American Vacuum Society, J. Vac. Sci. Technology. B14(6), Nov./Dec., 1996, pp. 3764-3769.

(Continued)

*Primary Examiner*—Joseph Williams
*Assistant Examiner*—Bumsuk Won

(57) ABSTRACT

A cathode with an improved work function, for use in a lithographic system, such as the SCALPEL™ system, which includes a buffer between a substrate and an emissive layer, where the buffer alters, randomizes, miniaturizes, and/or isolates the grain structure at a surface of the substrate to reduce the grain size, randomize crystal orientation and reduce the rate of crystal growth. The buffer layer may be a solid solution or a multiphase alloy. A method of making the cathode by depositing a buffer between a surface of the substrate and an emissive layer, where the deposited buffer alters, randomizes, miniaturizes, and/or isolates the grain structure at a surface of the substrate to reduce the grain size, randomize crystal orientation and reduce the rate of crystal growth.

13 Claims, 5 Drawing Sheets

U.S. PATENT DOCUMENTS

| | | | |
|---|---|---|---|
| 4,482,839 A * | 11/1984 | Wada et al. ............ 313/346 R | |
| 4,524,297 A | 6/1985 | Gartner | |
| 4,528,452 A | 7/1985 | Livesay | |
| 4,533,852 A | 8/1985 | Frank et al. | |
| 4,893,052 A | 1/1990 | Tanabe et al. | |
| 5,426,686 A | 6/1995 | Rentzepis et al. | |
| 5,911,919 A | 6/1999 | Billings | |
| 6,124,666 A | 9/2000 | Saito et al. | |
| 6,236,052 B1 | 5/2001 | Krijin | |

FOREIGN PATENT DOCUMENTS

| | | |
|---|---|---|
| EP | 0 845 797 A3 | 2/1999 |
| GB | 1 070 473 A1 | 6/1967 |
| JP | 57 128436 A | 8/1982 |

OTHER PUBLICATIONS

W.K. Waskiewicz et al., "Design of a Low-Brightness, Highly Uniform Source for Projection Electron-Beam Lithography (Scalpel)", Proc. SPIE, 1997, p. 3155.

J. Hasker et al.,; "Cathode and Scaling Properties Related to the Shape of Current-Voltage Characteristics", Applied Surface Science 24 (1985), pp. 73-74.

Hitchner JE and HU CT; "Polishing of Nickel-Iron by Reactive Ion Etching"; Apr. 1978; IBM Technical Disclosure Bulletin, vol. 20, No. 11A; XP-002374254; p. 4560.

Homma T, et al.; "The Influence of Surface Preparation on the Structures of Nickel Oxide Formed on the (100) Face of Nickel"; Oxidation of Metals, vol. 3, No. 5, 1971; XP009064249; pp. 463-473.

European Search Report dated Jul. 19, 2006; p. 5.

* cited by examiner

US 7,179,148 B2

CATHODE WITH IMPROVED WORK FUNCTION AND METHOD FOR MAKING THE SAME

This Application is a Divisional of prior application Ser. No. 09/338,520 filed on Jun. 23, 1999 now U.S. Pat. No. 6,815,876, currently pending, to Sungho Jin, et al. The above-listed Application is commonly assigned with the present invention and is incorporated herein by reference as if reproduced herein in its entirety under Rule 1.53(b).

BACKGROUND OF THE INVENTION

1. Field of the Invention

The present invention relates to a cathode for use in electron beam projection lithography and a method for making the cathode, and more particularly, to a cathode with an improved work function and a method for making the improved work function cathode.

2. Description of the Related Art

Projection electron beam lithography, such as Scattering Angular Limitation Projection Electron Beam Lithograph (SCALPEL™), utilizes electron beam radiation projected onto a patterned mask to transfer an image of that pattern into a layer of energy sensitive material formed on a substrate. That image is developed and used in subsequent processing to form devices such as integrated circuits.

The SCALPEL™ mask has a membrane of a low atomic number material on which is formed a layer of high atomic number material. The layer of high atomic number material has a pattern delineated therein. Both the low atomic number membrane material and the high atomic number patterned layer of material are transparent to the electrons projected thereon (i.e., electrons with an energy of about 100 keV). However, the low atomic number membrane materials scatters the electrons weakly and at small angles. The high atomic number patterned layer of material scatters the electrons strongly and at large angles. Thus, the electrons transmitted through the high atomic number patterned material have a larger scattering angle than the electrons transmitted through the membrane. This difference in scattering angle provides a contrast between the electrons transmitted through the membrane alone and the electrons transmitted through the layer of patterned material formed on the membrane.

This contrast is exploited to transfer an image of the pattern from the mask and into a layer of energy sensitive material by using a back focal plane filter in the projection optics between the mask and the layer of energy sensitive material. The back focal pane filter has an aperture therein. The weakly scattered electrons are transmitted through the aperture while the strongly scattered electrons are blocked by the back focal plane filter. Thus, the image of the pattern defined in the weakly scattered electrons is transmitted through the aperture and into the layer of energy sensitive material.

FIG. 1 is a schematic diagram illustrating the concept of a conventional SCALPEL™ system. A beam B of electrons 10 is directed towards a scattering mask 9 including a thin membrane 11 having a thickness between about 1,000 Å and about 20,000 Å (0.1 μm and about 2 μm thick.) The membrane 11 is composed of a material which is virtually transparent to the electron beam B composed of electrons 10. That is to say that electrons 10 in beam B pass through membrane 11 freely in the absence of any other object providing an obstruction to the path of electrons 10 in the beam B as they pass from the source of the beam through the membrane 11.

Formed on the side of the membrane 11 facing the beam 10, is a pattern of high density scattering elements 12 to provide a contrast mechanism that enables reproduction of the mask pattern at the target surface. The scattering elements 12 are patterned in the composite shape which is to be exposed upon a work piece 17 (usually a silicon wafer) which is coated with E-beam sensitive resist, which as shown in FIG. 1 has been processed into pattern elements 18. The electrons 10 from the E-beam B which pass through the mask 9 are shown by beams 14 which pass through electromagnetic lens 15 which focuses the beams 14 through an aperture 16' into an otherwise opaque back focal plane filter 16.

The aperture 16' permits only electrons scattered at small angles to pass through to the work piece 17.

A conventional SCALPEL™ exposure tool is illustrated in FIG. 2. The exposure tool 20 includes a source 22 (usually an electron gun), a mask stage 24, imaging optics 26, and a wafer stage 28. The mask stage 24 and the wafer stage 28 are mounted to the top and bottom of a block of aluminum, referred to as the metrology plate 30. The metrology plate 30, which is on the order of 3000 lbs., serves as a thermal and mechanical stabilizer for the entire exposure tool 20.

FIG. 3 illustrates a prior art source 22 in more detail. The source 22 includes a cathode 42, an anode 43, a grid electrode 44, focusing plates 45, and a filament 46. Each of the cathode 42, anode 43, grid electrode 44, and focusing plates 45 exhibit substantial circular and radial symmetry about an imaginary line of focus 50. In the prior art systems in U.S. Pat. No. 5,426,686, the cathode 42 is made of gallium arsenide (GaAs), bialkali cathode materials, cesium antimonide ($Cs_3Sb$), or a pure material having a low work function, such as tantalum (Ta), samarium (Sm), or nickel (Ni). In other prior art systems disclosed in U.S. Pat. No. 5,426,686, the material of photocathode 42 is made of a metal added to a semiconductor material by mixing or by depositing through sputtering or annealing. The metal is preferably tantalum (Ta), copper (Cu), silver (Ag), aluminum (Al), or gold (Au), or oxides or halides of these metals. One such example of a prior art photocathode is constructed from tantalum (Ta) annealed on the surface of nickel (Ni).

Most e-beam lithography systems (direct e-beam writing machines, etc.) require essentially point electron sources with high current densities. Conventional thermionic cathodes, such as pure metal (tungsten or tantalum), lanthanum hexaboride ($LaB_6$), etc. cathodes are sufficient for these applications.

In contrast, SCALPEL™ systems require a 1 mm² approximately parallel electron beam with a cross-sectional current density variation of within 2%. Conventional thermoionic cathodes have work function variations across the emitting surface substantially greater than 2%, for example 5–10%. However, as noted on page 3769 of "High emittance electron gun for projection lithography," W. Devore et al., 1998 American Vacuum Society, J. Vac. Sci. Technol. B 14(6), November/December 1996, pp. 3764–3769, the SCALPEL™ process requires a thermoionic cathode with a work function variation less than 2%.

The conventional cathode which meets the SCALPEL™ requirements for other parameters, such as emission uniformity, low work function, low evaporation rate, high voltage operating environment, and vacuum contamination resilience is a tantalum (Ta) cathode having a disk shape. The disk-shaped tantalum (Ta) cathode is made from cold or hot rolled tantalum (Ta) foils which are hot pressed into a micro-polycrystalline material. Because of its polycrystalline nature, the grains are substantially misoriented with each other (on the order of 5–20°). The conventional Ta cathode also has an uncontrolled grain size distribution between 5–400 µm. Due to the sensitivity of tantalum's work function to the crystallographic orientation, the conventional polycrystalline Ta cathode work function distribution is "patchy" (also on the order of 5–400 µm), varying from grain-to-grain (because of differing orientations) and resulting in an unacceptably patchy or non-uniform emission pattern. Growth of the misoriented and differing sized grains at a high operating temperature further aggravates the patchiness problem. The non-uniformities caused by grain misorientation, uncontrolled large grain sizes, and grain growth on the cathode surface at the high operating temperature are transferred by the SCALPEL™ electron optics down to the shaping aperture (the object plane) and eventually to the wafer surface (the imaging plane).

When used as a SCALPEL™ cathode, the conventional polycrystalline cathode materials experience grain growth and rough texture development (together termed "recrystallization") at the SCALPEL™ high operating temperatures (1200–2000° C.) and extended time period (greater than 1000 hours). Although the total emission current is satisfactory, structural developments at the cathode surface causes dark patches to appear on the cathode surface and make the cathode unacceptable for SCALPEL™. In addition, conventional cathode materials, such as $LaB_6$, are easily contaminated by the SCALPEL™ operating environment, as described in "Design of a low-brightness, highly uniform source for projection electron-beam lithography (SCALPEL)", W. K. Waskiewicz et al., Proc. SPIE, 3155 (1997).

SUMMARY OF THE INVENTION

The present invention solves these problems with conventional cathodes used in SCALPEL™ and similar systems by providing a cathode that has a buffer between a polycrystalline substrate and an emissive layer.

The work function of the conventional polycrystalline substrate surface is non-uniform due to the non-uniform grain crystallography of the substrate material at the surface. These non-uniformities include grain misorientations on the order of 5–20° and grain size variations from 5–400 µm. Recrystallization over time also results in an increase in grain size and misorientation. The buffer alters, randomizes, miniaturizes (preferably to grain sizes less than 4 µm), and/or isolates the emissive layer, in a crystallographic sense, from the underlying substrate. The buffer also reduces the rate at which the substrate and emissive layer recrystallize over time.

In an example where the cathode is a refractory metal or carbon cathode (e.g., a tantalum cathode) the buffer also includes a refractory metal or carbon.

In one example, the substrate is tantalum, the buffer is a dual layer of molybdenum and tungsten, and the emissive layer is tantalum. The molybdenum modifies the tantalum structure (lattice constant and orientation) in the underlying substrate by dissolving into the substrate, which reduces grain misorientation. The tungsten also dissolves into the substrate and, as a result of its high melting temperature, reduces the rate of recrystallization of both the underlying tantalum substrate and the overlying tantalum emissive layer. In particular, the buffer reduces the rate at which the substrate and emissive layer recrystallize over time by at least 30% and preferably by 50%.

In another example, rhenium and tantalum are codeposited to form the buffer. The codeposit forms fine-grained (less than 4 µm) intermetallic phases and reduces subsequent recrystallization of the substrate and emissive layer. The codeposit does not adversely affect the electron transport from the substrate to the emissive layer, and has a coefficient of thermal expansion that approximates (within 35%, more preferably within 25%) that of the substrate and the emissive layer.

However, the codeposit interacts with the substrate in a way that is different from the interaction between the substrate and the molybdenum. The codeposit does not dissolve and does not alter the original structure of the substrate but rather blocks and dominates the original substrate surface. In effect, the structure of the codeposit dominates the substrate, composed of randomly oriented fine grains of Re-Ta intermetallic phases (less than 4 µm) resulting in a uniformly distributed, averaged work function. The end result however, is the same; the emissive layer is effectively isolated from the substrate and not affected by the crystal structure of the substrate surface.

In another example, the substrate is tantalum, the buffer is rhenium, and the emissive layer is tantalum. The rhenium modifies the tantalum structure in the underlying substrate by reacting with the tantalum to form Re-Ta intermetallic phases, similar to those obtained with the Re-Ta codeposit and that minimizes the misorientation of the grains.

DETAILED DESCRIPTION OF THE PREFERRED EMBODIMENT

Figure 1:
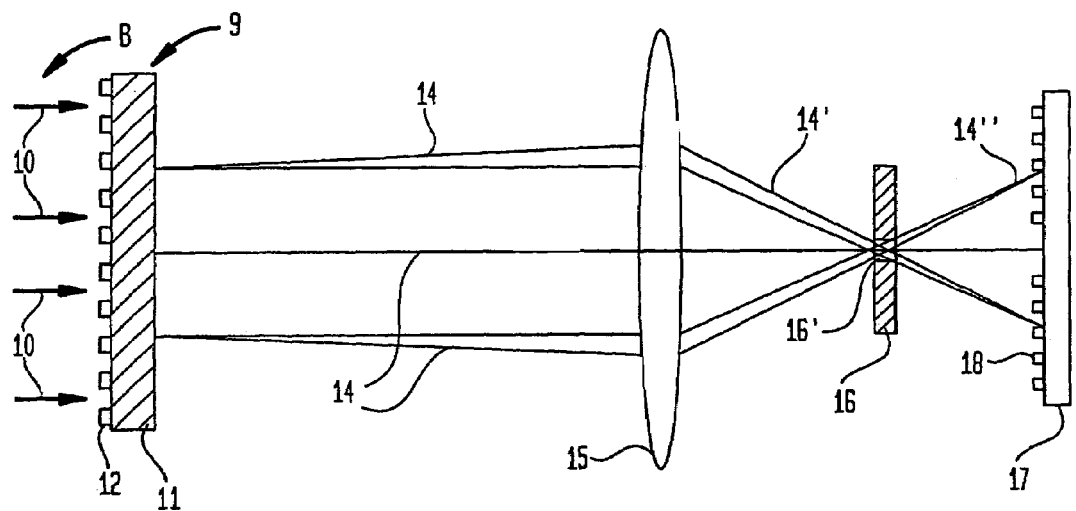
FIG. 1 is a schematic diagram illustrating the concept of a SCALPEL™ (Scattering Angle Limited Projection E-beam Lithography) system.
Figure 2:
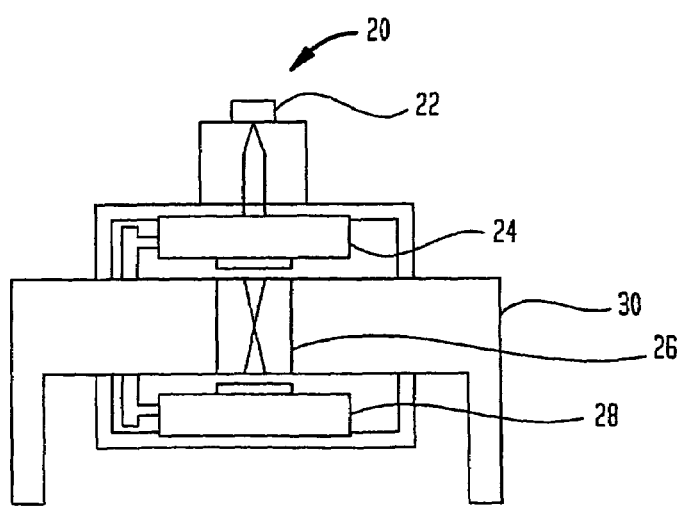
FIG. 2 illustrates a conventional SCALPEL™ exposure tool.
Figure 3:
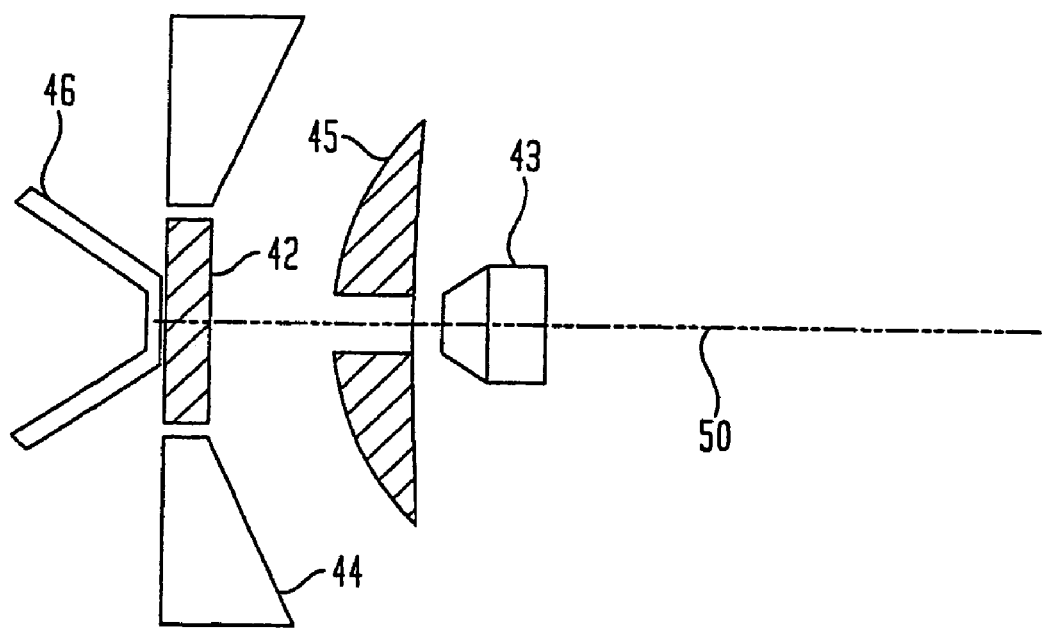
FIG. 3 illustrates a conventional source for the SCALPEL™ system of FIG. 1.
Figure 4:
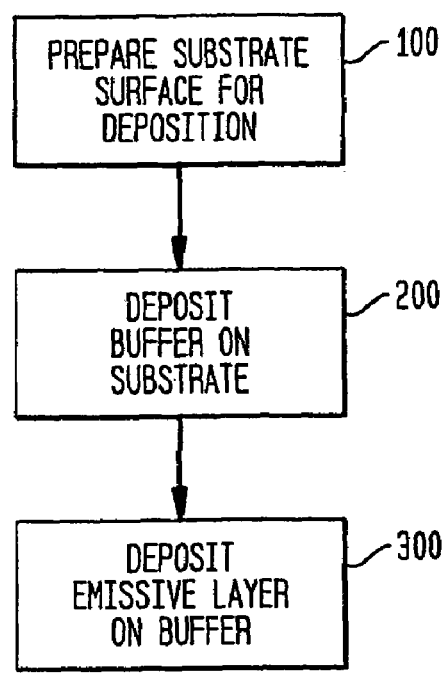
FIG. 4 illustrates a general method of making the cathode of the present invention.

FIG. 4 illustrates a general embodiment of the method of making the cathode of the present invention. As illustrated in FIG. 4, in step 100, a surface of a substrate is prepared for deposition. In step 200, a buffer is deposited on the substrate. In step 300, an emissive layer is deposited on the buffer, in order to produce the cathode.

In more particular embodiments, the surface of the substrate is prepared by ion etching and vacuum annealing. Further, the buffer and/or the emissive layer are deposited by magnetron sputter deposition. Further, in preferred embodiments, vacuum annealing is performed after deposition of both the buffer and the emissive layer.

In other preferred embodiments, the buffer and layers may be deposited by a number of different methods, such as sputtering, evaporation, chemical vapor deposition (CVD), etc. The desired thickness of the buffer is typically in the range of 0.1 µm to 100 µm, or preferably in the range of 0.5–10 µm.

Figure 5:
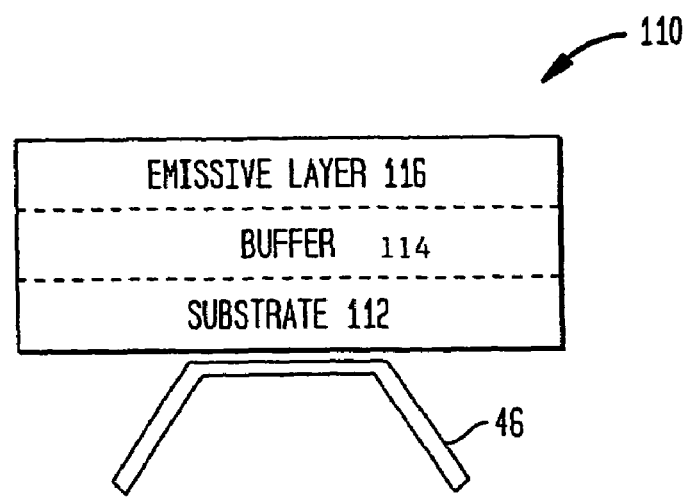
FIG. 5 illustrates the general cathode of the present invention.

FIG. 5 illustrates a cathode of the present invention in one embodiment. In particular, FIG. 5 illustrates that the cathode 110 includes a substrate 112, a buffer 114, an emissive layer 116, arranged as illustrated in FIG. 4.

In one embodiment, the buffer 114 is an altered grain structure at a surface of the substrate 112 to make the work function distribution more uniform. In another embodiment, the buffer 114 is itself a fine-grained, randomized structure that blocks the substrate 112, thereby improving the uniformity of the work function distribution of the resulting cathode 110.

In more particular embodiments of the present invention, the buffer 114 alters the grain structure at the surface of the substrate by diffusion, alloying, precipitation, or new phase formation. Still further, the buffer 114 includes atoms from a chemical class similar to the chemical class of the substrate 112. For example, if the substrate 112 is a refractory metal or carbon, then the buffer 114 would also include refractory metal or carbon atoms.

In another preferred embodiment, the cathode is part of a projection electron lithography system, such as the SCALPEL™ system.

The buffer 114 also provides thermal and electrical conductivities and good adhesion to withstand operating temperatures up to 2100° K. One additional advantage of the cathode 110 illustrated in FIG. 5, is that such a layered cathode can be made in a curved shape (concave or convex), which is useful for electron beam focusing.

EXAMPLE 1

Example 1 describes a first material combination that is effective in creating the desired structural uniformity and work function uniformity on the polycrystalline Ta cathode surface. Example 1 is a Ta/Mo/W/Ta arrangement, where Ta is the polycrystalline substrate surface, Mo/W are two sequentially applied buffer layers, and Ta is the emissive layer.

In the Ta/Mo/W/Ta system, both Mo and W have the same body centered cubic (bcc) structure as Ta, and form solid solutions. Because of the relatively small size of Mo atoms, the first buffer of Mo atoms diffuse into the Ta substrate upon annealing at 1600° C. This Mo diffusion alters the crystalline structure of the existing Ta grains. The subsequent W layer further alters the grain structure on the surface by diffusion to form a solid solution of Ta—Mo—W. The final Ta layer serves as the emissive layer because it has the lowest work function of the three.

Figure 6A:
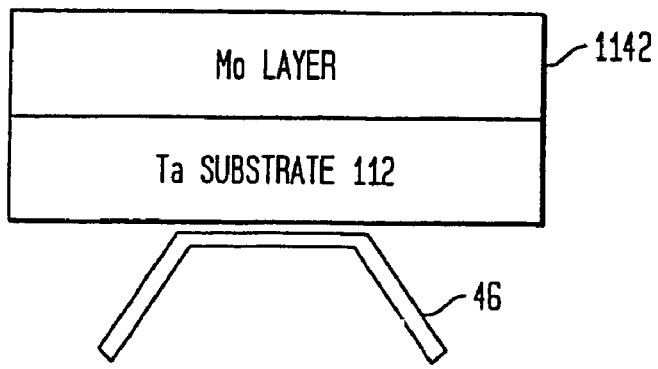
FIGS. 6A–6C illustrate a cathode with a solid solution buffer region.
Figure 6B:
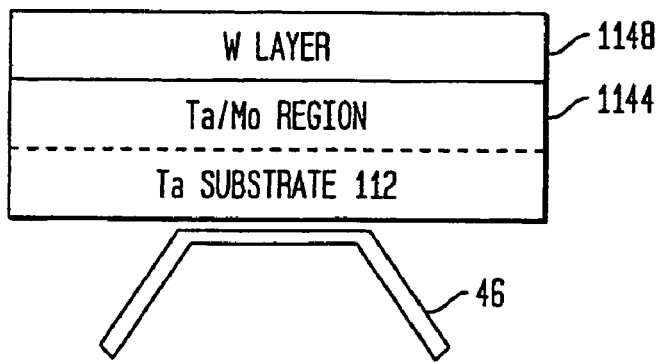
Figure 6C:
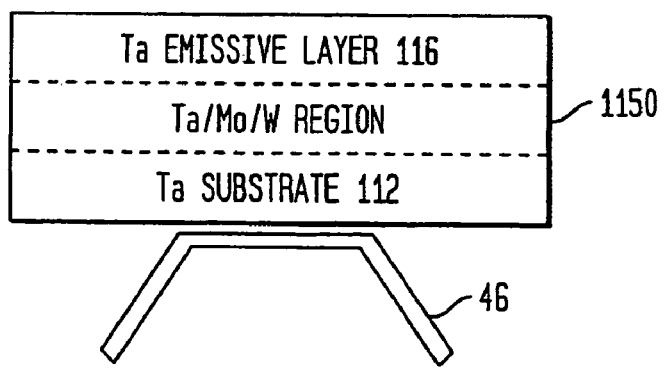

In FIG. 6A, an Mo layer 1142 is added to the Ta substrate 112. Because of the relatively small size of the Mo atoms, the Mo atoms diffuse into the Ta substrate 112 upon annealing at 1600° C. This Mo diffusion alters or distorts the crystalline structure of the existing Ta grains to form Ta/Mo region 1144, thereby randomizing the orientation of the Ta substrate. Then, a W layer 1148 is added, as illustrated in FIG. 6B. The W layer 1148 further randomizes the grain structure on the surface by diffusion to form a solid solution of Ta/Mo/W at 1150. Finally, the Ta emissive layer 116 is added, as illustrated in FIG. 6C. The final Ta layer serves as the emissive layer, because it has the lowest work function of the three. The grain structure of the Ta layer 116 is also randomized because of the underlying Ta/Mo/W region 150.

The Mo layer 1142 and W layer 1148 are typically added at a thickness of 0.5–10 µm. In other preferred examples, both the Mo layer 1142 and the W layer 1148 may be selected from the group including Mo, W, Nb, V, Ir, Rh, or any combination thereof.

EXAMPLE 2

Figure 7:
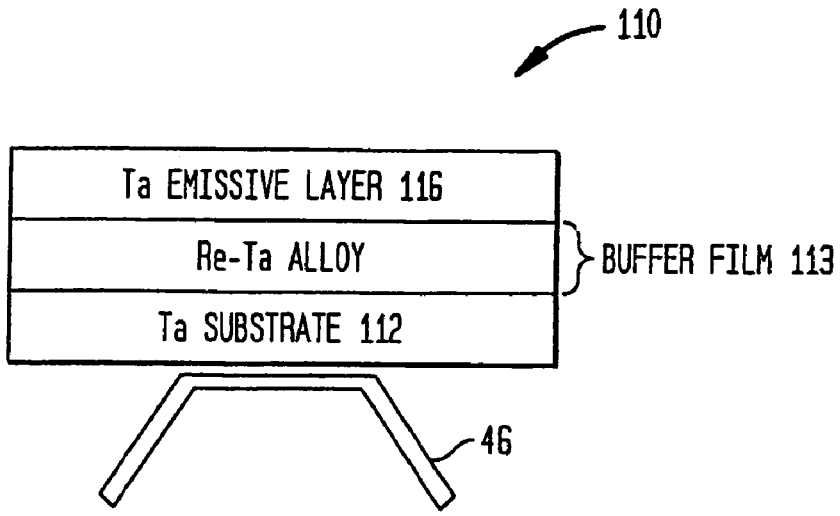
FIG. 7 illustrates a cathode with an alloy buffer film.

Example 2 describes a second material combination that is effective in creating the desired structural uniformity and work function uniformity on the polycrystalline Ta cathode surface. Example 2 is a Ta/Re—Ta/Ta arrangement, where Ta is the polycrystalline substrate 112, Re—Ta is an alloyed buffer film 113, and Ta is the emissive layer 116, as illustrated in FIG. 7.

Because Re has a hexagonal close-packed (hcp) structure, it forms various intermetallic compounds with Ta. The co-sputtered Re—Ta alloy film 113 thus consists of fine-grained (<4 µm), randomly oriented surface structure, which blocks the original polycrystalline grain structure of the Ta substrate 112. The subsequent emissive Ta layer 116 also has the same fine grain structure because of the Re—Ta alloy film 113. Because of the formation of intermetallic compounds and the resultant multiphase structure, the grains in the substrate 112 are largely pinned by the new phases of the buffer film 113 at the boundaries and their growth is inhibited at the operating temperature (2100° K). Also Re has a close match with Ta in its thermal expansion coefficient, and as a result, the buildup of thermal stress which cause film delamination and cracking, is reduced.

Although the intermetallic compound of Example 2 is a Re—Ta alloy, other combinations are also effective including C—Ta, Hf—Ta, Os—Ta, and Ru—Ta.

EXAMPLE 3

Example 3 describes a third material combination that is effective in creating the desired structural uniformity and work function uniformity on the polycrystalline Ta cathode surface. Example 3 is a Ta/Re/Ta arrangement, where Ta is the polycrystalline substrate 112, Re is a buffer layer 1160, and Ta is the emissive layer 116, as illustrated in FIG. 8.

Figure 8A:
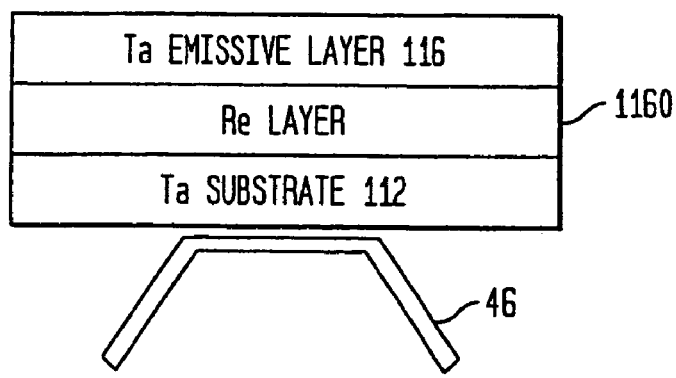
FIG. 8A–8B illustrate another cathode with a solid solution buffer region.
Figure 8B:
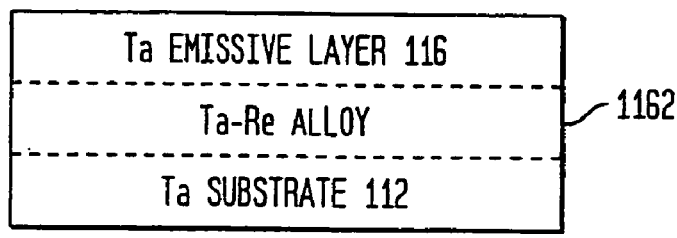

In FIG. 8A, a Re layer 1160 is added to the Ta substrate 112. The Re reacts with Ta to form Re—Ta intermetallic compounds. Similar to Example 2, these Re—Ta intermetallic compounds have a fine grained (<4 µm) randomly oriented surface structure, which block the original polycrystalline grain structure of the Ta substrate 112. Finally, the Ta emissive layer 116 is added, as illustrated in FIG. 8B. The final Ta layer serves as the emissive layer, because it has the lowest work function of the three. The grain structure of the Ta layer 116 is fine and randomized because of the underlying Re—Ta alloy 1162.

The material arrangements in Examples 1–3 have shown improved uniform emission characteristics in emission microscopes and SCALPEL™ machines compared to the conventional Ta cathode.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of making a thermoionic cathode, comprising:
   preparing a surface of a substrate;
   depositing a buffer on the substrate; and
   depositing an emissive layer on the buffer, said buffer inhibiting interaction of said emissive layer and said substrate by way of one of altering, and altering and blocking said substrate.

2. The method of making the thermoionic cathode of claim 1, said step of preparing the surface of the substrate including the steps of, ion etching and vacuum annealing the surface of the substrate.

3. The method of making the thermoionic cathode of claim 1, wherein the buffer is deposited by sputtering.

4. The method of making the thermoionic cathode of claim 1, wherein the emissive layer is deposited by sputtering.

5. The method of making the thermoionic cathode of claim 1, further comprising:
   vacuum annealing the buffer, after deposition of the buffer; and
   vacuum annealing the emissive layer, after deposition of the emissive layer.

6. The method of claim 1, said buffer further randomizing a crystallographic orientation of the grain structure at the surface of the substrate contacting the buffer.

7. The method of claim 1, said buffer further miniaturizing grain sizes of grains at the surface of said substrate contacting said buffer.

8. The method of claim 7, wherein the grain sizes of the grains at the surface of said substrate are less than 4 µm.

9. The method of claim 1, wherein said buffer modifies a grain structure at a surface of said substrate contacting said buffer by one of altering and blocking.

10. The method of claim 9, wherein the buffer alters the grain structure at the surface of the substrate contacting the buffer by at least one of diffusion, alloying, reaction, precipitation, and new phase formation.

11. The method of claim 10, wherein the buffer is deposited by co-sputtering Ta and at least one of Re, C, Hf, Os, and Ru on the substrate.

12. The method of claim 11, wherein the buffer is deposited by sputtering at least one of Re, C, Hf, Os, and Ru on the substrate.

13. The method of claim 9, said buffer blocking the grain structure at the surface of said substrate contacting said buffer by at least one of alloying, reaction, precipitation, and new phase formation.

* * * * *